United States Patent
Luc

(10) Patent No.: US 11,867,205 B2
(45) Date of Patent: Jan. 9, 2024

(54) CYLINDER PISTON ROD AND METHOD OF FABRICATION THEREOF

(71) Applicant: Industries Mailhot Inc., Terrebonne (CA)

(72) Inventor: Mainville Luc, Joliette (CA)

(73) Assignee: INDUSTRIES MALHOT INC., Quebec (CA)

( * ) Notice: Subject to any disclaimer, the term of this patent is extended or adjusted under 35 U.S.C. 154(b) by 781 days.

(21) Appl. No.: 16/321,803

(22) PCT Filed: Jul. 27, 2017

(86) PCT No.: PCT/CA2017/050900
§ 371 (c)(1),
(2) Date: Jan. 29, 2019

(87) PCT Pub. No.: WO2018/018149
PCT Pub. Date: Feb. 1, 2018

(65) Prior Publication Data
US 2020/0378411 A1 Dec. 3, 2020

Related U.S. Application Data

(60) Provisional application No. 62/368,301, filed on Jul. 29, 2016.

(51) Int. Cl.
*F15B 15/14* (2006.01)
*C23C 14/02* (2006.01)
(Continued)

(52) U.S. Cl.
CPC ........ *F15B 15/1457* (2013.01); *C23C 14/024* (2013.01); *C23C 14/0611* (2013.01);
(Continued)

(58) Field of Classification Search
CPC ............... C23C 14/024; C23C 14/0611; C23C 14/0254; C23C 14/27
See application file for complete search history.

(56) References Cited

U.S. PATENT DOCUMENTS

| 2013/0252860 A1* | 9/2013 | Komori | ................ C10M 141/10 |
| | | | 508/108 |
| 2014/0020555 A1* | 1/2014 | Silverio | ................ C23C 28/042 |
| | | | 92/169.1 |
| 2017/0284428 A1* | 10/2017 | Okuhira | ................ C25D 11/04 |

FOREIGN PATENT DOCUMENTS

| JP | 2010150641 A * | 7/2010 | ........... C23C 14/024 |
| KR | 20110026712 | 3/2011 | |

(Continued)

OTHER PUBLICATIONS

Machine translation of the Abstract of KR20110026712.
(Continued)

*Primary Examiner* — Kelly M Gambetta
(74) *Attorney, Agent, or Firm* — Howard M. Gitten, Esq.; Lewis Brisbois Bisgaard & Smith LLP

(57) ABSTRACT

A piston for a cylinder, and a method of fabrication thereof, the piston rod comprising a substrate and a coating, the substrate having a surface roughness profile comprising peaks and valleys with a peak-to-valley height in a range between 0.5 and 2 μm, and the coating having a hardness in a range between 1000 and 4000 HV and a coefficient of friction in a range between 0.1 and 0.05.

10 Claims, 10 Drawing Sheets

(51) Int. Cl.
*C23C 14/06* (2006.01)
*C23C 16/02* (2006.01)
*C23C 16/27* (2006.01)
*F16J 7/00* (2006.01)

(52) U.S. Cl.
CPC .......... *C23C 16/0254* (2013.01); *C23C 16/27* (2013.01); *F16J 7/00* (2013.01); *F15B 2215/305* (2013.01)

(56) References Cited

FOREIGN PATENT DOCUMENTS

| KR | 20110026712 A | * | 3/2011 | |
|---|---|---|---|---|
| WO | WO-9713886 A1 | * | 4/1997 | ............. C23C 16/26 |
| WO | 2012/088571 | | 7/2012 | |
| WO | 2016/039123 | | 3/2016 | |

OTHER PUBLICATIONS

Search Report dated Oct. 11, 2017, in corresponding International PCT Application No. PCT/CA2017/050900, filed on Jul. 27, 2017.

\* cited by examiner

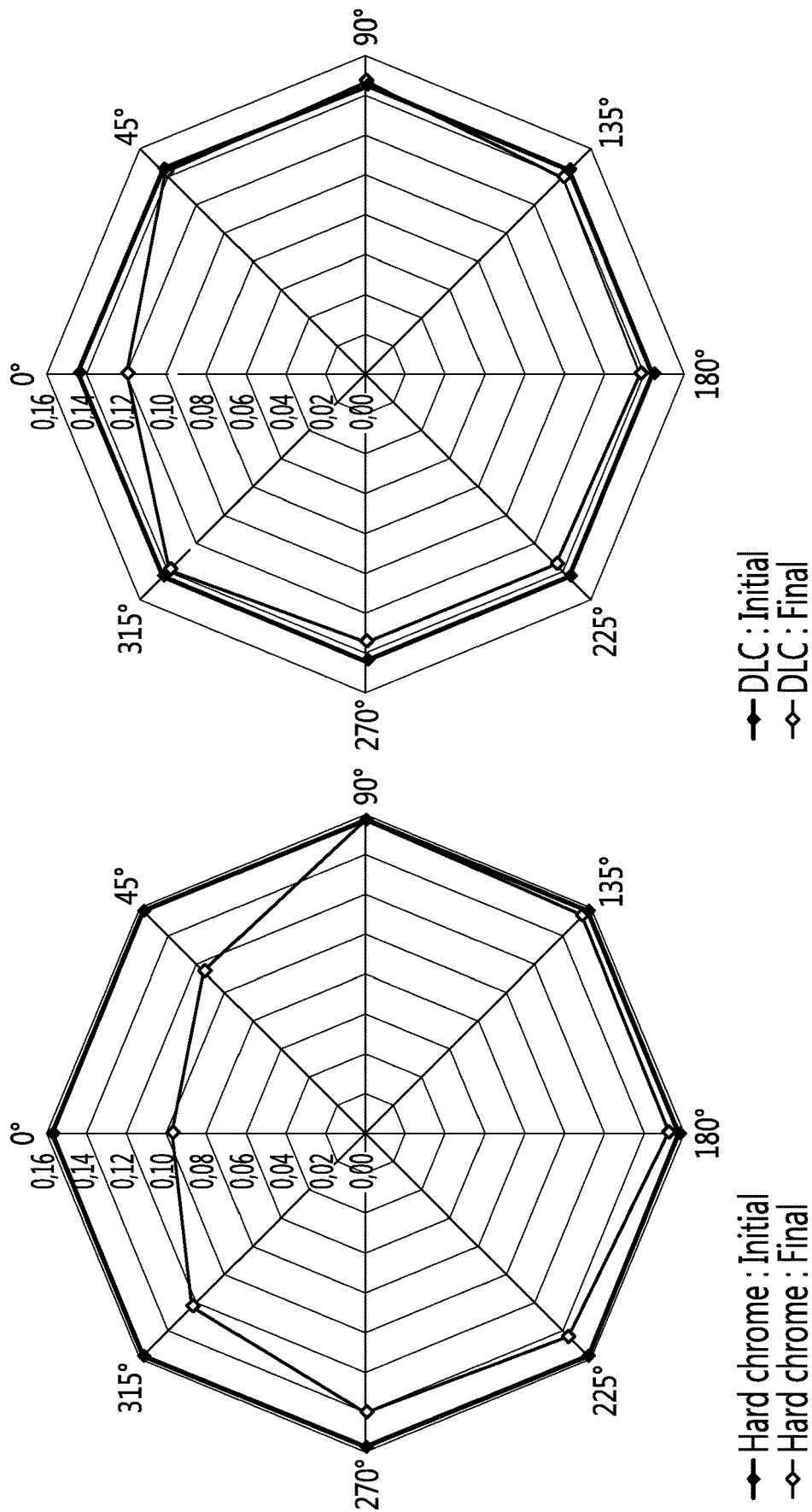

CYLINDER PISTON ROD AND METHOD OF FABRICATION THEREOF

CROSS-REFERENCES TO RELATED APPLICATIONS

Priority is hereby claimed under 35 U.S.C. §§ 119(a)-(d), 120, 363 and 365(b) and (c) to National Entry Application of PCT application no PCT/CA2017/050900 filed on Jul. 27, 2017 and published in English under PCT Article 21(2) as WO 2018 018149, which itself claims benefit of U.S. provisional application Ser. No. 62/368,301, filed on Jul. 29, 2016. All documents above are incorporated herein in their entirety by reference.

FIELD OF THE INVENTION

The present invention relates to a cylinder piston rod. More specifically, the present invention is concerned with a low friction contact for cylinder.

BACKGROUND OF THE INVENTION

A hydraulic cylinder comprises a number of moving parts in contact. Hydraulic cylinders are used to convert energy from a pressurized hydraulic fluid into a mechanical work. Friction between the moving parts, which oppose the movement of the rod, results in mechanical energy waste. Moreover, running clearance that being allowed from one side of the piston to the other side thereof, resulting in hydraulic energy waste. Energy efficiency is thus defined as the ratio between the mechanical work effectively delivered by the cylinder and the energy the cylinder consumes.

The energy wastes occurring in the cylinder itself add up to energy wastes occurring in other components of the overall hydraulic system, including valves, tubings etc. . . . these wastes are multiplied by the energy efficiency ratio of the generators, i.e. pumps, and of the energy sources, i.e. electric motors or heat engines. Thus, even a small energy waste occurring in the cylinder itself may result in a non-negligible energy waste.

In a number of industries using hydraulic or pneumatic cylinders, piston rods are in steel and typically coated with hard chrome, i. e. with a surface hardness in a range between 800 and 1150 HV.

The main functions of the surface coating of the rods are resistance to wear, reduction of friction, surface finish durability and resistance to corrosion.

Some applications require higher resistance to wear and/or to corrosion. In such cases, a layer of nickel may be provided under the hard chrome coating (Ni—Cr), or other coatings or surface treatments are provided such as nitriding, cobalt-phosphorus coatings, thermal projections (High Velocity Oxygen Fuel (HVOF) coating, High Velocity Air Fuel (HVAF), plasma, etc.) of different nature $Cr_2O_3/TiO_2$, WC—Co, WC—Co—Cr, $Cr_2C_3$/NiCr, for example), etc.

There is still a need in the art for a low friction contact for cylinder.

SUMMARY OF THE INVENTION

More specifically, in accordance with the present invention, there is provided a piston rod for a cylinder, said piston rod comprising a substrate and a coating, the substrate having a surface roughness profile comprising peaks and valleys with a peak-to-valley height in a range between 0.5 and 2 µm, and the coating having a hardness in a range between 1000 and 4000 HV and a coefficient of friction in a range between 0.1 and 0.05.

There is further provided a method for making a piston rod for a cylinder, comprising selecting a substrate, providing a surface roughness profile comprising peaks and valleys with a peak-to-valley height in a range between 0.5 and 2 µm, and depositing a coating of a hardness in a range between 1000 and 4000 HV and a coefficient of friction in a range between 0.1 and 0.05.

There is further provided a cylinder comprising a piston rod comprising a substrate and a coating, the substrate having a surface roughness profile comprising peaks and valleys with a peak-to-valley height in a range between 0.5 and 2 µm, and the coating having a hardness in a range between 1000 and 4000 HV and a coefficient of friction in a range between 0.1 and 0.05.

Other objects, advantages and features of the present invention will become more apparent upon reading of the following non-restrictive description of specific embodiments thereof, given by way of example only with reference to the accompanying drawings.

BRIEF DESCRIPTION OF THE DRAWINGS

In the appended drawings:

FIG. 9A shows the variation of the average roughness Ra of the surface of the rod in case of a hard chrome coating;

FIG. 9B shows the variation of the average roughness Ra of the surface of the rod in case of a diamond-like carbon (DLC) coating.

DESCRIPTION OF EMBODIMENTS OF THE INVENTION

Figure 1:
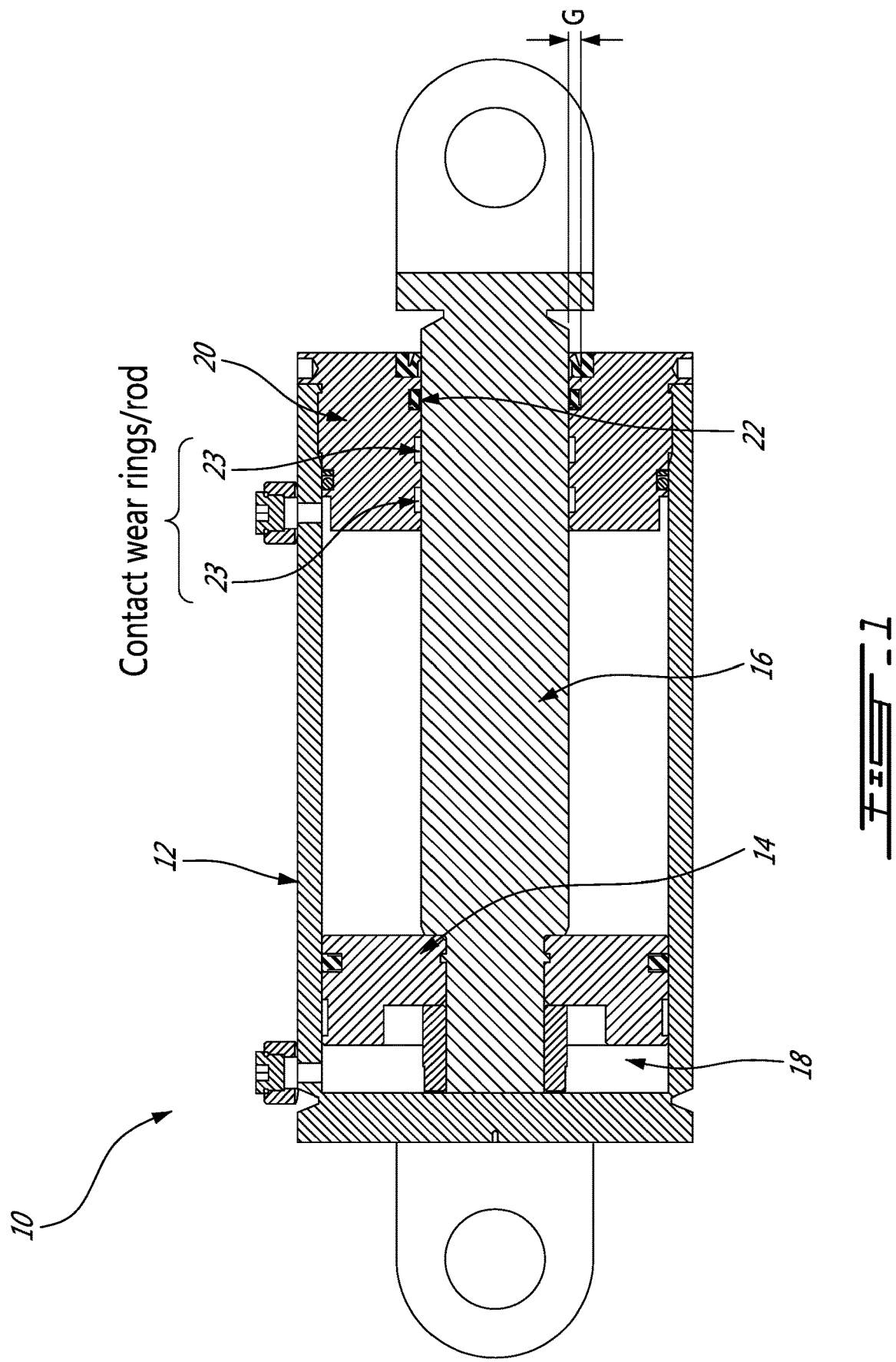
FIG. 1 is a partial longitudinal cross-sectional view of a cylinder.

A hydraulic cylinder 10, as illustrated for example in FIG. 1, generally comprises a cylindrical barrel 12, in which a piston 14 connected to a piston rod 16 moves back and forth. The barrel 12 is closed on a first side thereof by a cap 18 and at a second side thereof by a cylinder head 20 where the piston rod 16 comes out of the barrel 12. The piston 14 reciprocates in the barrel 12 and divides the cylinder 10 into a cap end chamber and a head end chamber.

The barrel 12 is typically a tube. The cap 18 encloses the pressure chamber at the first end thereof. It is connected to the body of the cylinder 12 by welding, threading, bolts, or tie rod. A static seal or an o-ring may be used in between the cap 18 and the barrel 12. The cylinder head 20 encloses the pressure chamber at the second end thereof. The head 20 is connected to the body of the cylinder 12 by means of threading, bolts, or tie rod. A static seal or an o-ring is used in between head 20 and the barrel 12.

The piston 14 separates the pressure zones inside the barrel 12. The piston 14 is attached with the piston rod 16 by means of threads, bolts, or nuts to transfer the linear motion. The piston 14 is a metallic member or a plastic member, typically machined with grooves to fit elastomeric or metal seals and bearing elements.

The rod 16 attaches to the piston 14 and extends from the cap end of the cylinder 10 through to the head end. The rod may be made in steel, stainless steel, aluminum or a plastic such as polyethylene for example.

The head 20 comprises sealing elements to prevent the pressurized oil from leaking past the interface between the rod 16 and the head 20, such as surface finish fluid seal 22, typically in a plastic material, urethane, or Polytetrafluoroethylene (PTFE) for example. The piston rod 16 is exposed to diverse operating conditions. It is in friction contact with the fluid seal 22. Wear rings 23 are also provided to guide the rod 16 and absorb lateral forces occurring during operation; wear rings are typically in plastic, Nylon composites, phenyl polysulfur (PPS) or PTFE.

The surface finish of the piston rod 16 determines the performance and durability of a cylinder. Usually, a sequence of polishing steps is applied on the rod surface so as to achieve a surface roughness profile, comprising peaks and valleys, characterised by 2D or 3D profilometry.

Figure 2:
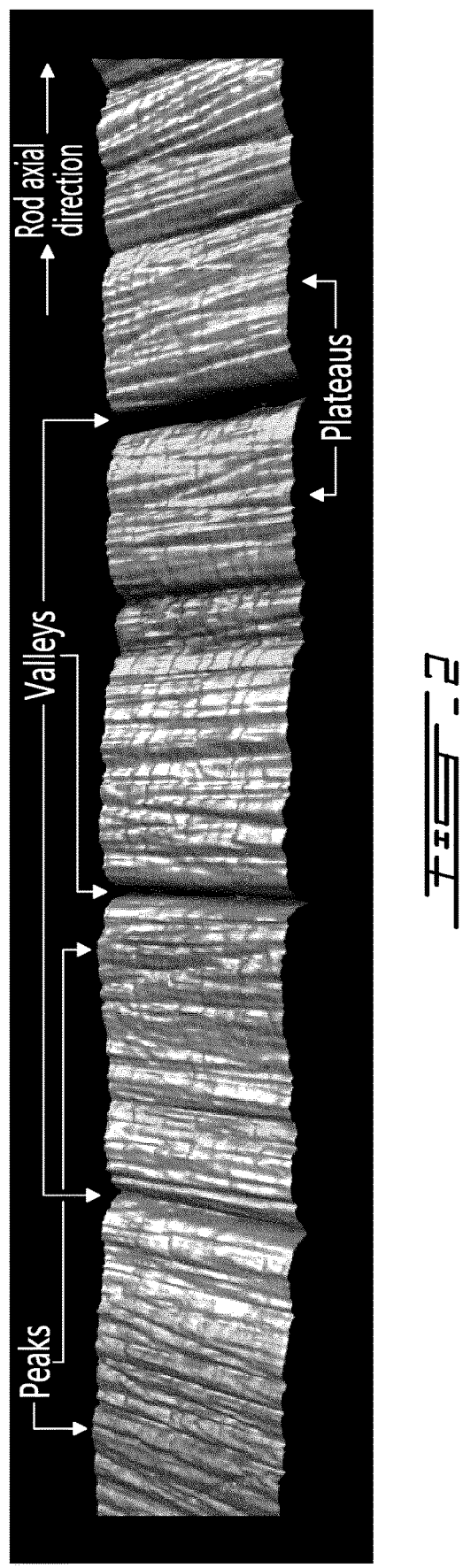
FIG. 2 shows a rod surface finish obtained by 3D topography measurement.

FIG. 2 shows a typical 3D topography of the surface finish of a rod 16, of a height between bottom of valleys and summit of peaks, i.e. peak-to-valley, in a range between 0.5 and 2 µm. During operation of the cylinder, the fluid seal 22 and the wear ring 23 are thus in contact with such a surface comprising peaks and valleys.

Valleys of the roughness profile of the rod surface provide lubricant retention. The lubricant, i.e. usually hydraulic oil, reduces the friction between the elements 23, 22 and the rod 16. As the surface of the rod 16 wears out, its lubricant retention capacity diminishes, and the friction increases, which increases the rate of wear of the sealing elements.

A number of parameters affect the friction and the wear rate of the rod surface roughness, including the environment and operating conditions. For instance, lateral loads applied to the rod 16 when it is in its extended position are found to increase friction forces between the wear ring and the piston rod.

Friction within the cylinder head occurs mainly between 1) the rod and the wear rings and between 2) the rod and the sealing elements.

Friction between the rod and the wear rings is dependent on a number of parameters, such as the materials in contact and lateral loads.

In a cylinder, the main wear modes include adhesive wear and abrasive wear. These wear modes involve wear mechanisms such as plastic deformation or brittle fracture. Hence, for example, the wear of a steel rod with a chrome finish may result in tearing out of material and liberation of chrome particles in the region of contact. Such liberated chrome particles may in turn cause wear mainly by embedding themselves within the sealing joint (two body abrasion), or by being displaced between the two moving surfaces (three body abrasion). These wear mechanisms wear the chrome finish by generating scores along the movement direction.

Figure 3:
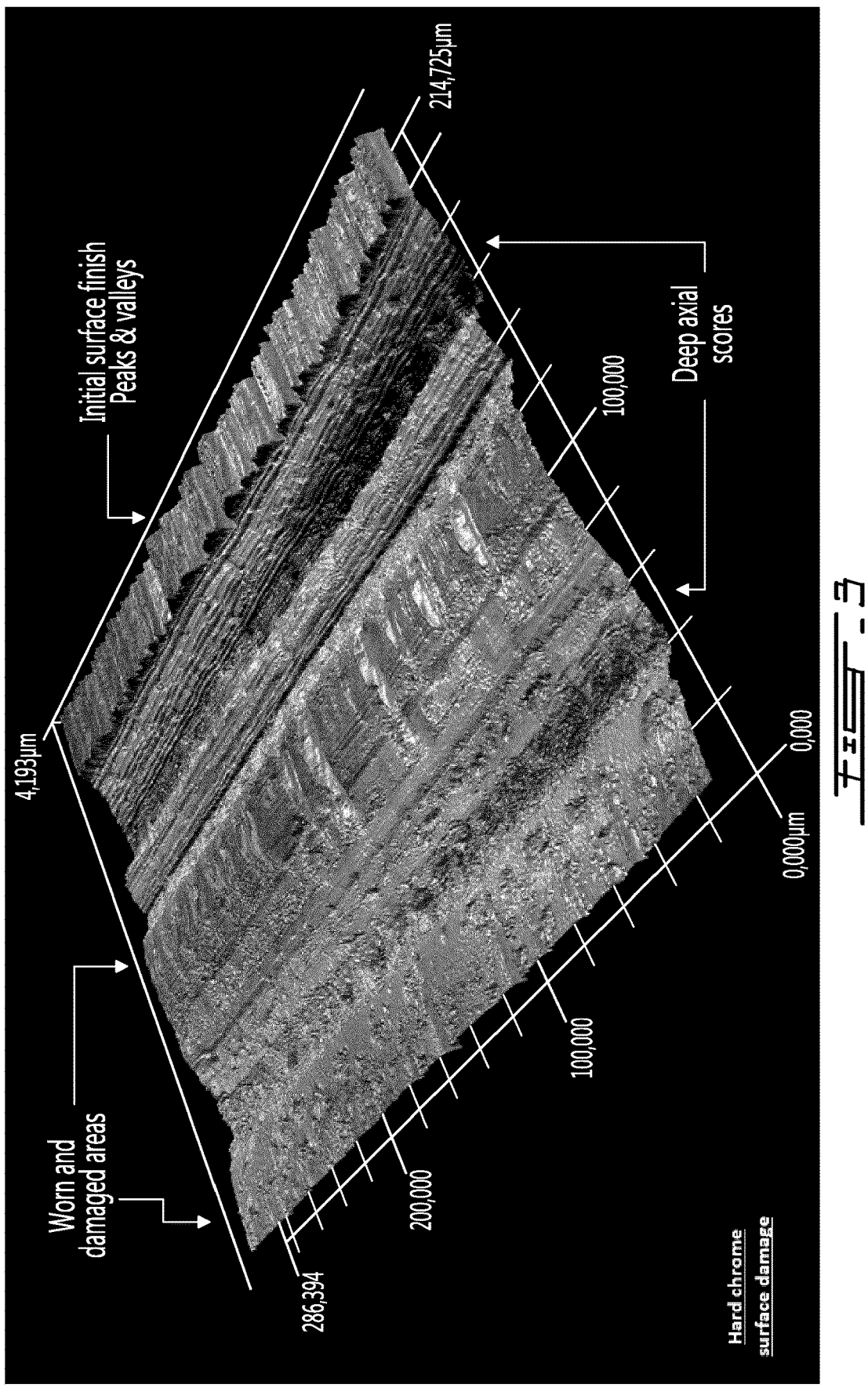
FIG. 3 shows surface damage typical of a hard chrome plated cylinder rod.

FIG. 3 shows a topography obtained by 3D roughness measurement that provides a detailed view of scores and wear typically observed on a hard chrome plated cylinder rod.

A diamond-like carbon (DLC) coating, of a thickness in a range between 1 and 5 µm, with a high resistance to abrasive wear, a low coefficient of friction, i.e. in a range between 0.1 and 0.05, and a hardness in a range between 1000 and 4000 HV, depending on its chemical composition and of deposition parameters, hence a high resistance to wear, is provided on the rod surface. The friction coefficient of the DLC coating depends on operating temperature, pressure, speed and atmosphere.

The diamond-like carbon (DLC) coating comprises an external carbon based layer. A plurality of under layers may be provided between the substrate and the external carbon based layer; they may be metallic such as for example Cr, Ni, Ni—P, Ni—W, Co—P, or nitrides such as for example CrN, TiN, or oxides such as for example $Cr_2O_3/TiO_2$, or carbides such as for example WC—Co, or silicium or carbon based such as for example Si—C—N, Si—C—H, WCC, ta-C, a-C:H.

Due to its amorphous structure, diamond-like carbon (DLC) is submitted to wear mechanisms that are different from those of metallic coatings. DLC may grow an antiwear tribofilm on antagonist surfaces, thereby reducing friction. It may also reduce wear by adhesion due to its low surface energy. These mechanisms may limit the generation of particles in the contact zone, thereby reducing wear by abrasion.

The presence of contaminants, such as dust or debris, in the operating environment of the cylinder or in the hydraulic fluid may accelerate the wear of the sealing elements, as they may embed themselves within the materials of the moving parts. If the hardness of these contaminant particles is high enough compared to the hardness of the rod surface, either embedded or not, they may cause scorings. As DLC has a hardness in a range between 1000 and 4000 HV for example, higher than chrome, which has a hardness in a range between 800 and 1150 HV for example, DLC coating reduces this type of abrasion wear.

Thus, a piston rod may be selected in a metal such as steel, stainless steel, aluminum etc. . . . depending on the specific application, for example in steel AISI 1045 or in stainless steel 17-4 PH with or without an existing surface coating and/or treatments such as nitriding, cobalt-phosphorus coatings, thermal projections (High Velocity Oxygen Fuel (HVOF) coating, High Velocity Air Fuel (HVAF), plasma, etc.) of different nature $Cr_2O_3/TiO_2$, WC—Co, WC—Co—Cr, $Cr_2C_3$/NiCr, for example), etc. Then the rod 16 is provided with a coating deposited by physical vapor deposition (PVD) or by chemical vapor deposition (CVD). PVD methods may be arc, sputter, laser or other vapor deposition methods. CVD methods include plasma assisted (PA) or enhanced (PE), radio-frequency (RF), direct current (DC) discharge, Penning ionization gauge (PIG), ion beam, electron beam, and other methods.

Prior to or following the coating, the surface finish of the rod may be modified by polishing, microbead blasting, texturization etc . . . .

A series of experiments were done to assess and quantify the benefits of diamond-like carbon coatings applied to a cylinder rod. The results were compared to a similar hard chrome plated rod. In most tests, the tested rods were made of steel and had a diameter of 76 mm.

An experimental test bench was used to measure friction and simulate wear. The rig comprised a test cylinder rod assembled through a cylinder head fitted with an assembly comprising a fluid seal and a wear ring. While the cylinder head was maintained stationary, the rod was cycled in alternative linear movement at a determined speed for a given number of cycles. A water cooling system was used to maintain the assembly at a specified temperature throughout the test. For certain tests, a secondary cylinder was used to apply a lateral load on the cylinder head assembly to simulate side loads. For other tests, a small hydraulic pump was used to apply a constant hydraulic pressure to the fluid seal 22 inside the cylinder head. Load cells were used to measure the axial force, i.e. friction, and the lateral load at a specified sampling rate. After completion of the tests, the parts were disassembled and inspected for wear analysis, the measured friction curves were compiled and coefficients of friction were calculated.

In a first series of tests, a piston rod was submitted to an alternative linear movement over a distance of 15 cm at a speed of 300 mm/s over 100 000 cycles, within the cylinder head. A lateral load of 20 kN was applied to the cylinder head so as to simulate a lateral load on the moving rod. Such lateral load increases the friction between the wear rings 23 and the piston rod 16. The assembly was maintained at a temperature of 60° C. using a cooling system. The friction coefficient μ was measured using load cells to measure the axial force $F_A$ and for measuring the lateral force $F_L$ using the following relation:

$$\mu = F_A/F_L$$

Figure 4:
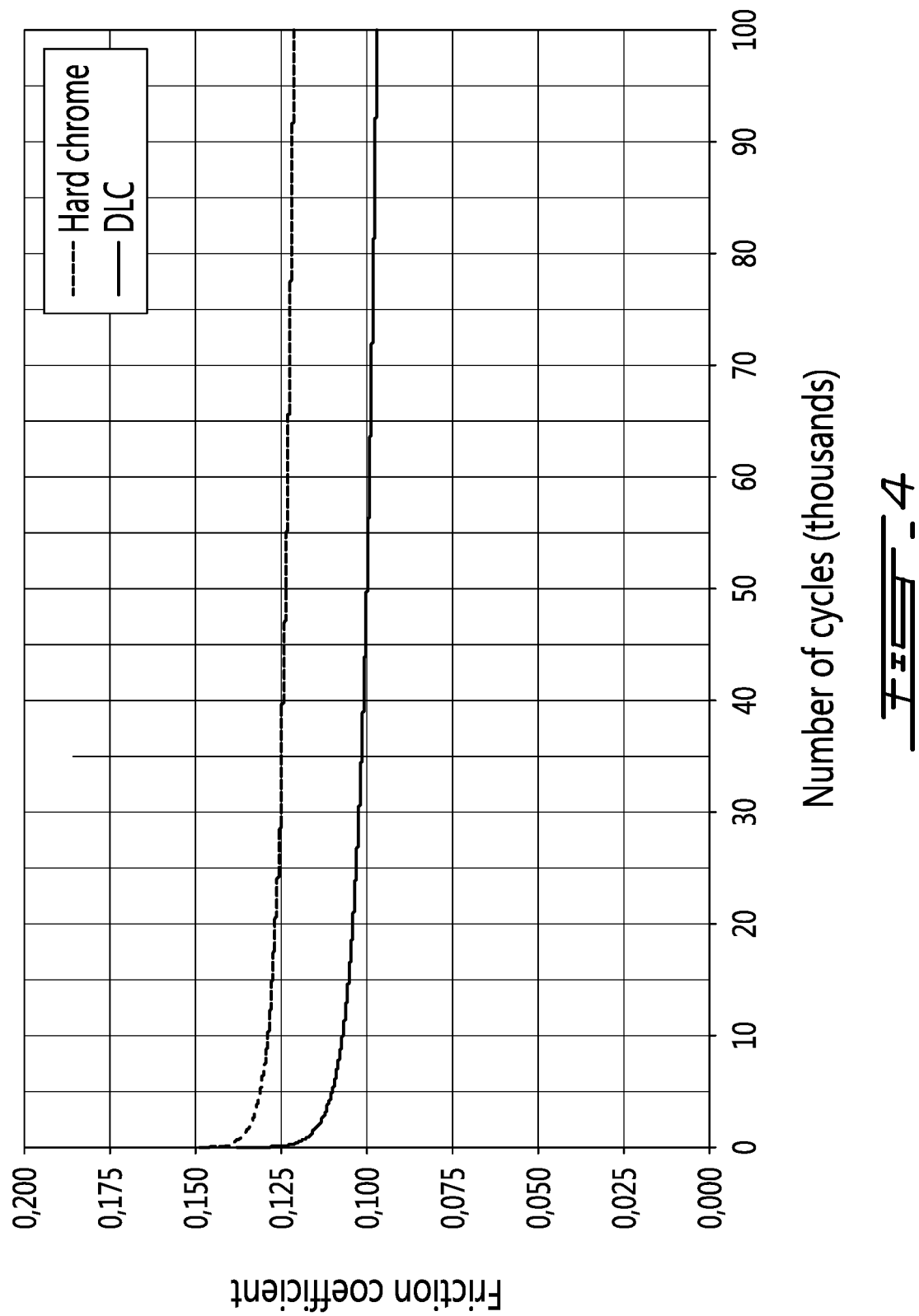
FIG. 4 shows coefficients of friction between the rod and the wear ring, in case of a hard chrome plated rod and of a DLC coated rod.

As can be seen in FIG. 4, obtained without pressure submitted, the friction coefficient between the rod and the wear ring 23 was reduced by up to 25% in the case of a rod 16 having a DLC coating, friction coefficient for hard chrome being around 0.125 while the friction coefficient for DLC was around 0.100.

In a second series of tests, a piston rod was moved in a linear alternating movement over a distance of 15 cm at a speed of 300 mm/s over 200 000 cycles within a pressurized cylinder head. The pressure within the cylinder head was 1500 psi. A lateral load of 12.5 kN was applied to the cylinder head so as to simulate a lateral load on the moving rod. The assembly was maintained at a temperature of about 60° C. using a cooling system. Pressurized hydraulic oil was recirculated inside the cylinder head assembly using a small gear pump. The axial force $F_A$ and the lateral force $F_L$ were measured using load cells while the pressure P was recorded using a manometer. The test was done first with a hard chrome plated rod and then with a DLC coated rod. To account for both the external lateral force and the radial downforce generated by the pressurized fluid seal 22, the coefficient of friction was approximated using the following relation:

$$\mu = F_A/(F_L + d*G*P)$$

where d is the inner diameter of the seal 22 and G is the width of the seal on which hydraulic pressure is applied.

Figure 5:
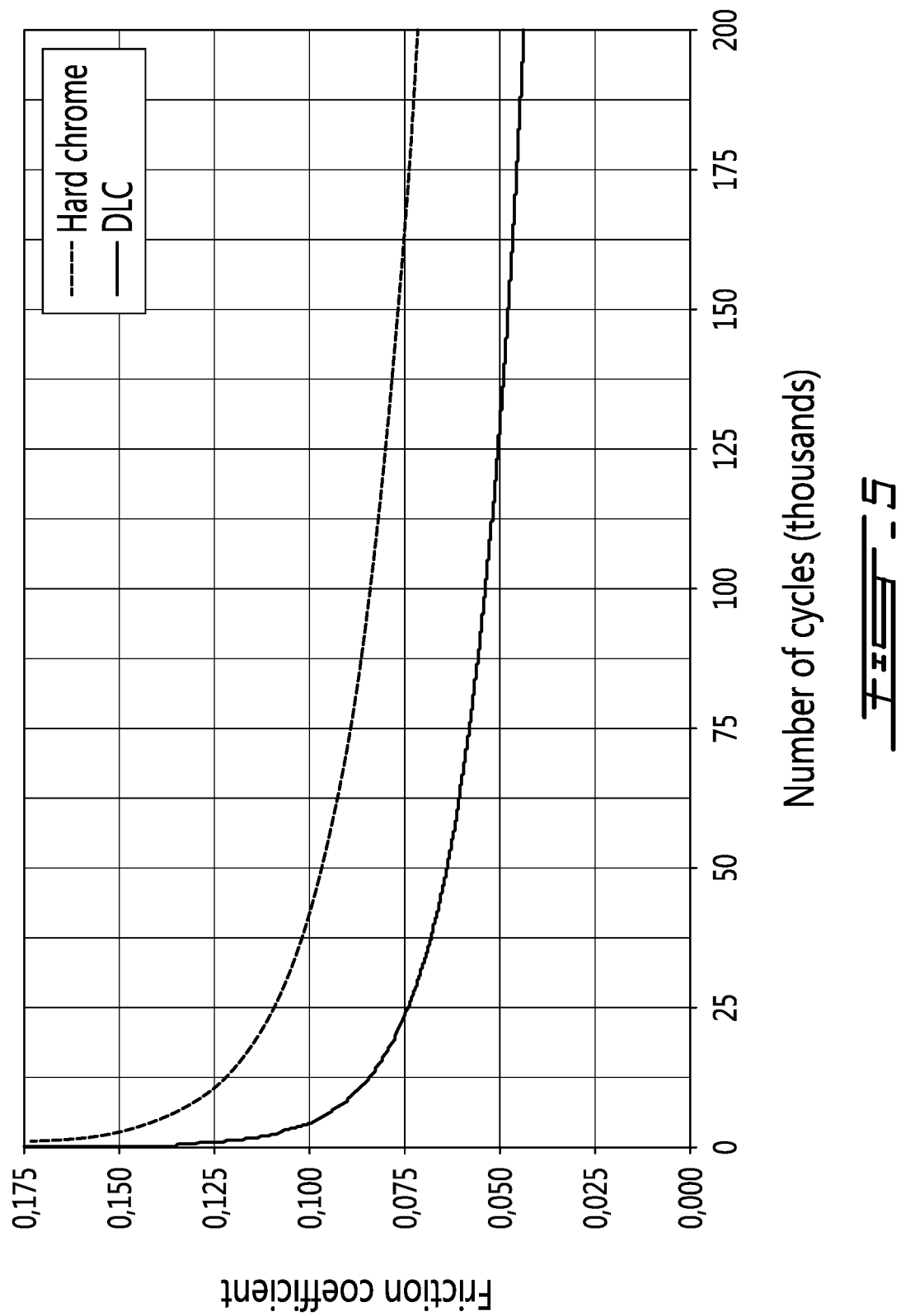
FIG. 5 shows coefficients of friction between the rod and a pressured fluid seal, in case of a hard chrome plated rod and of a DLC coated rod.

As can be seen in FIG. 5, the friction coefficient between the rod and cylinder head assembly was lower in the case of the DLC rod assembly. Over the last 100 000 cycles, the average friction coefficient for the DLC rod assembly was about 0.050±0.008 whereas the average friction coefficient for the hard chrome rod assembly was about 0.075±0.016. The average reduction of the between the stabilized friction coefficient was around 33%.

A DLC coating of a thickness in a range between 1 and 5 μm on the rod forms a sealing surface of a very low friction coefficient for the contact between the rod 16 with the wear ring 23 and with the fluid seal 22, thereby reducing the wear rate of the surface finish, i.e. maintaining the surface finish with valleys and peaks, thereby maintaining the lubricant retention capacity of the surface finish, when compared to a hard chrome rod.

Figure 6:
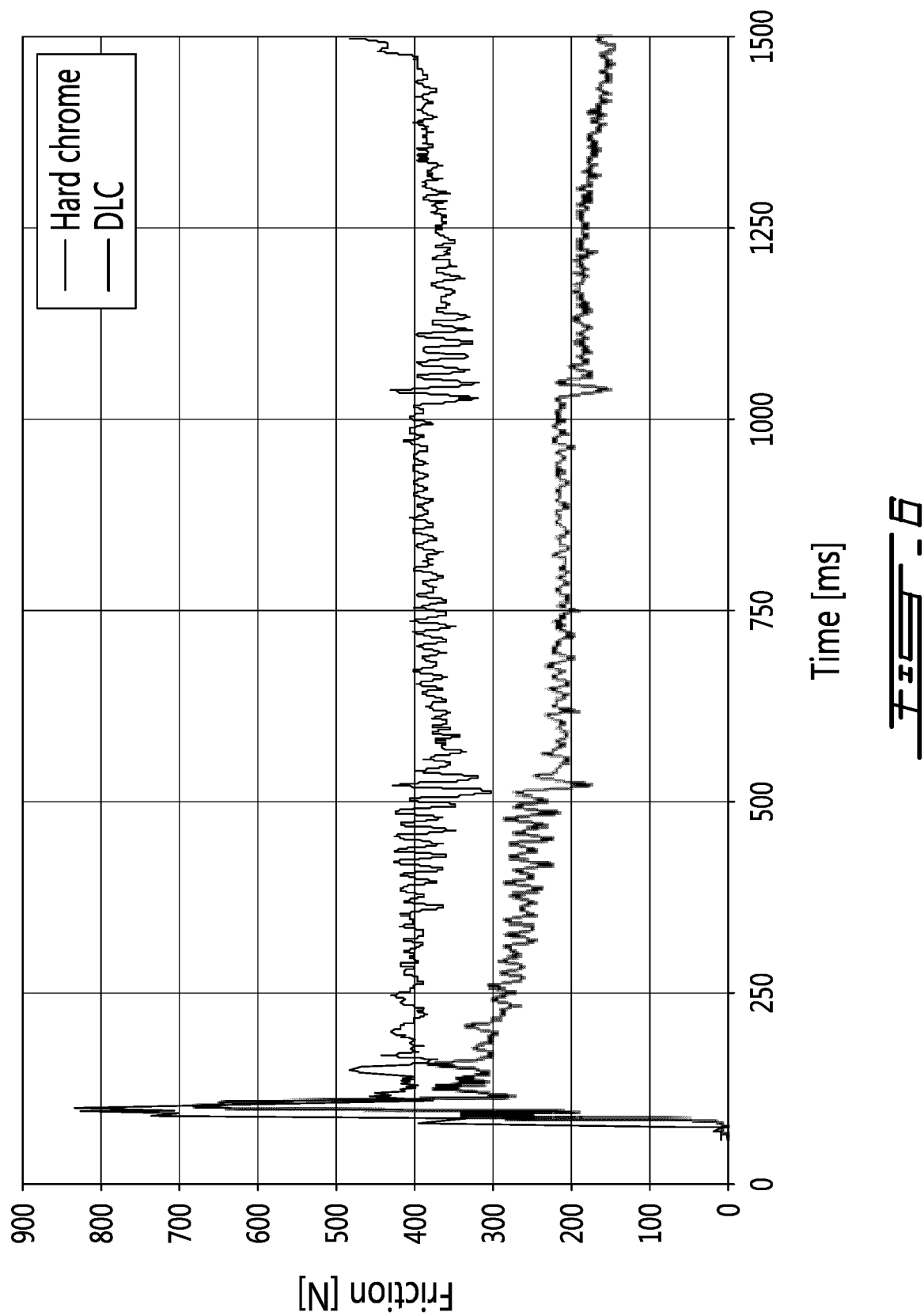
FIG. 6 shows friction curves over a single extension stroke for a hard chrome rod and a DLC cylinder rods.

In a third series of tests, a hard chrome plated piston rod was moved in a linear alternating movement over a distance of 15 cm at a speed of 300 mm/s over a few cycles within a pressurized cylinder head at room temperature. The pressure within the cylinder head was 1500 psi. The friction force was measured at a sampling rate of 1000 Hz to record the friction curve over a single extension stroke. After completing the test, a DLC coating was applied on the exact same rod and the test was conducted again in the conditions previously described. FIG. 6 shows the data obtained where both friction curves are plotted. For this test, it was found that once the rod was coated with DLC, its static friction decreased by up to 20% and its average dynamic friction decreased by up to 35% compared to the same rod with a hard chrome plating.

From these results, it was found that a DLC coating on the rod can reduce the friction coefficient between the rod and the cylinder head assembly 22, 23, when compared to a hard chrome rod.

A DLC coating on the rod was also found to greatly enhance its durability as a sealing countersurface by reducing the wear rate of the surface finish, when compared to a similar rod with a hard chrome coating.

Figure 7:
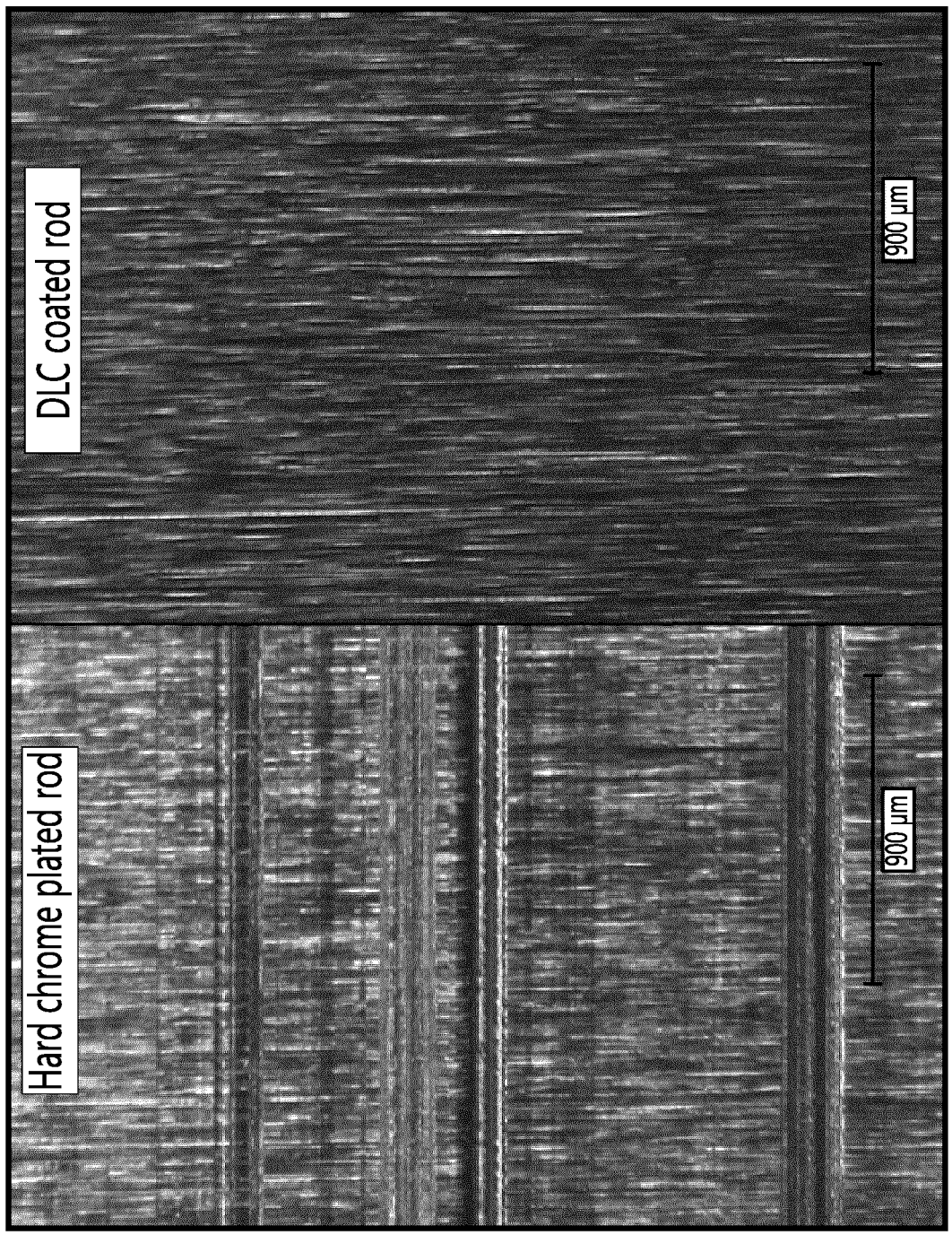
FIG. 7 shows a side-by-side comparison of surface damage and scoring for both a hard chrome plated rod and a DLC coated rod tested for 100 000 cycles under 20 kN of lateral force.

FIG. 7 shows a side-by-side comparison of surface damage and scoring for both a hard chrome plated rod and DLC coated rod tested for 100 000 cycles under 20 kN of lateral force, as described hereinabove.

The resistance to wear was first assessed by monitoring the average roughness Ra of the rod surface in various zones around the circumference of the rod in the zone showing the most wear, at the start of the test ($Ra_{initial}$), and at the end thereof ($Ra_{final}$). The surface roughness Ra was measured by 2D roughness measurement. As shown in FIG. 9, in the case of a hard chrome covered rod, the roughness on the surface of the rod decreased from 0.16 to 0.10 μm over the course of the test, i.e. the wear was about 38%, while in the case of a DLC coated rod, the roughness decreases from 0.14 to 0.12 μm, i.e. the wear was about 14%.

Figure 8A:
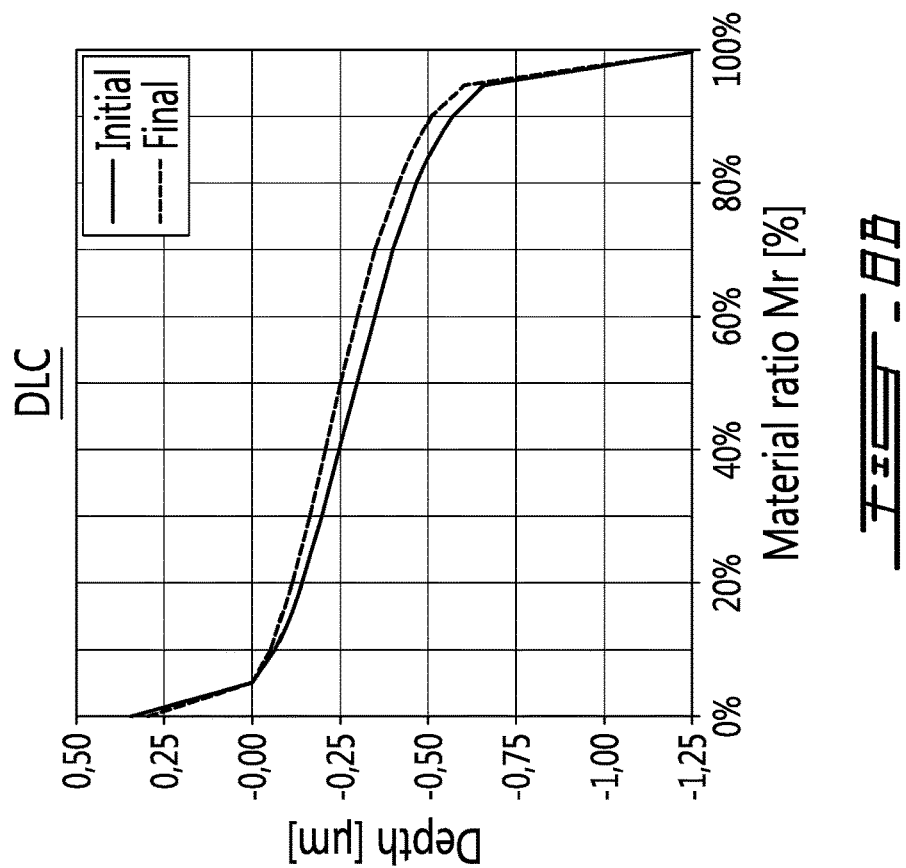
FIG. 8A shows the variation of material ratio Mr over 200 000 cycles in the case of a hard chrome coating.
Figure 8B:
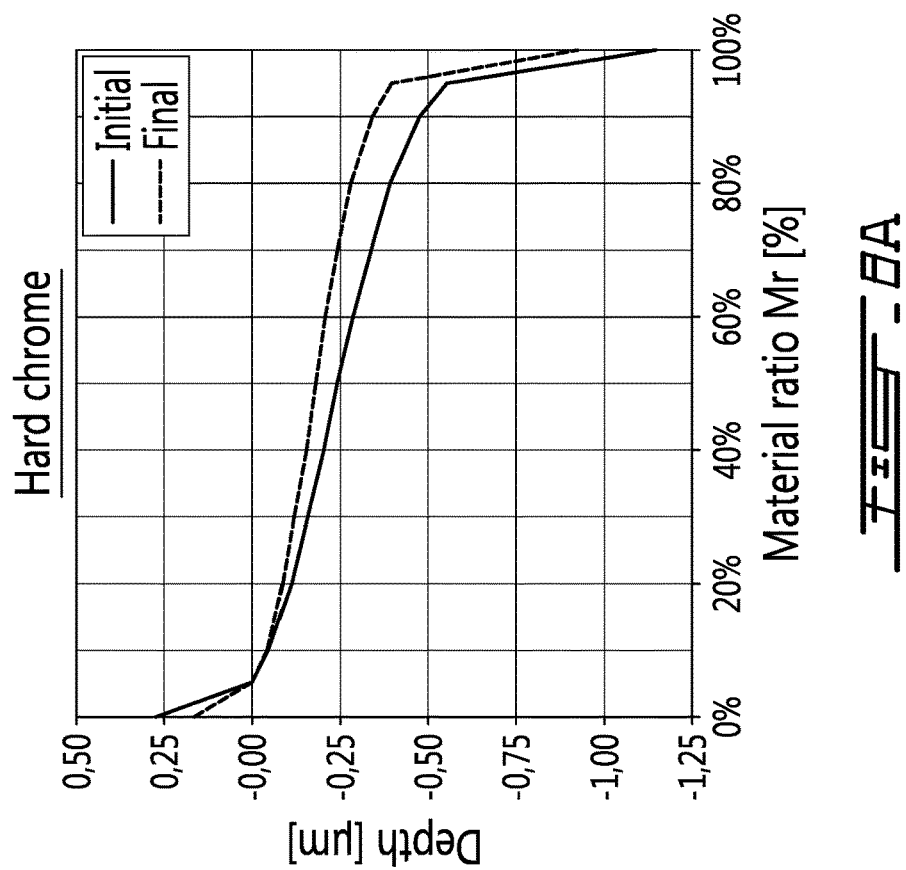
FIG. 8B shows the variation of material ratio Mr over 200 000 cycles in the case of a diamond-like carbon (DLC) coating.

Furthermore, the bearing area curve (also known as Abbott Firestone Curve) of rods was plotted by measuring the material ratio in the zone most exposed to friction. As shown in the FIG. 8, it was found that the bearing area curve of the DLC coated rod had changed significantly less than the bearing area curve of the hard chrome plated rod. The result is that the height distribution of the roughness profile remains unchanged longer than that of the chrome rod, i.e. the DLC surface finish is more durable. Similarly, other roughness parameters showed a decrease in the case of chrome. For example, for the chrome rod, the parameter Rvk, which describes the lubricant retention capacity of the surface, changed from an average of 0.22 μm to an average of 0.17 μm, i.e. a 22% decrease, whereas the Rvk parameter for the DLC rod remained constant at 0.25 μm before and after the test. Similar decreases were noted for the Rz and Rv parameters, which describe respectively the average height of the profile, and the maximum valley depth. The DLC rod surface finish was mostly unchanged after the test with regards to these parameters.

These results show that DLC allows the rod surface properties to be preserved longer under heavy surface pressure conditions, thus maintaining its ability to better lubricate the fluid seal under reciprocating motion and, ultimately, prolonging the hydraulic cylinder life.

Test to assess resistance to corrosion due to salt mist were further performed. It was shown that a DLC coating on rods systematically increased the time length before onset of corrosion compared to hard chrome coated rods.

Figure 10:
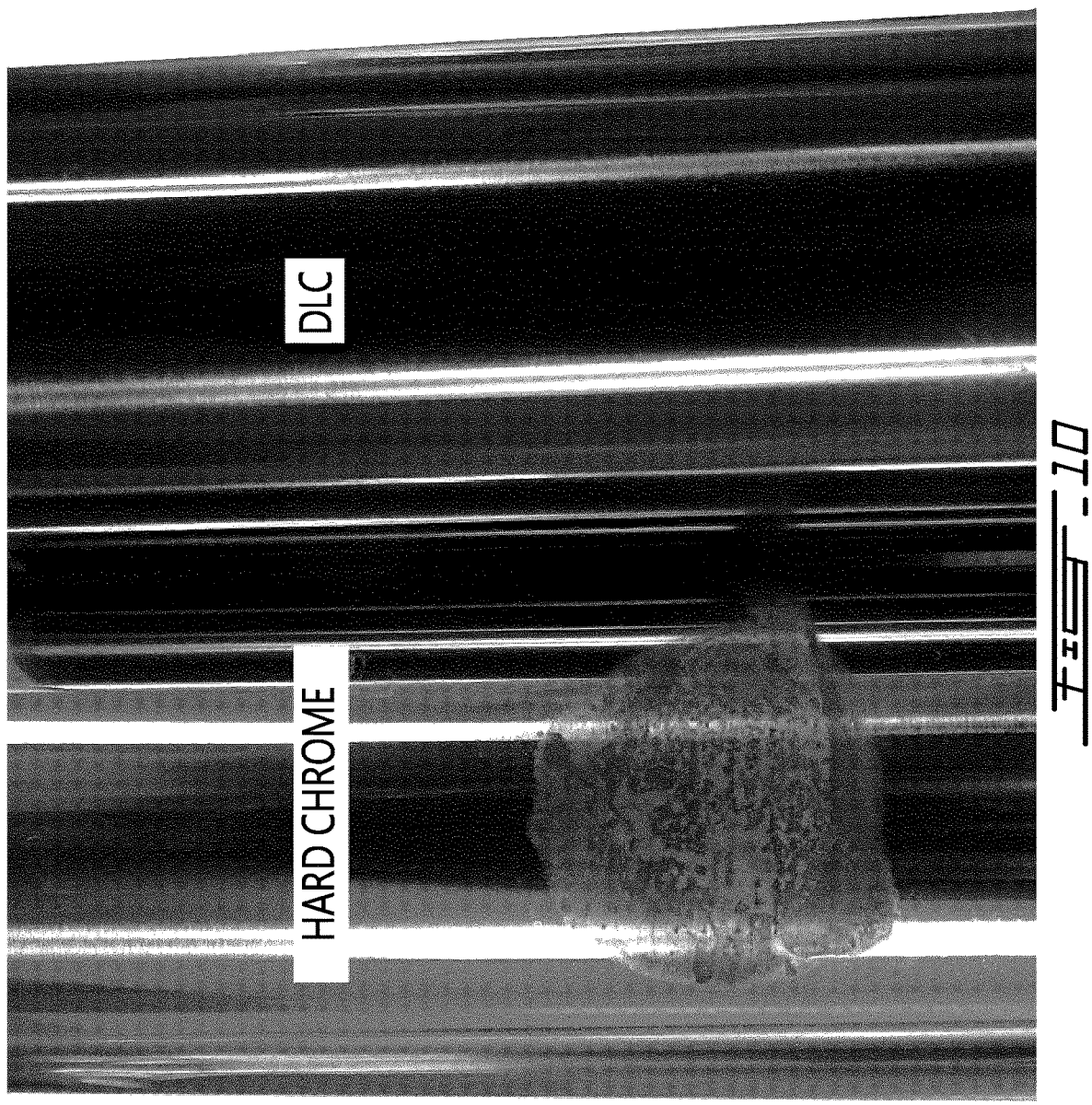
FIG. 10 shows the corrosion after exposure to acidic solution drops, on a hard chrome plated surface (left handside) and on a diamond-like carbon (DLC) coated surface (right handside) after same exposition.

Resistance to corrosion was tested by contacting an acid solution (HCl) with a rod having a hard chromium coating and with a rod having a DLC coating. After 60 minutes to a drop by drop exposition, corrosion was first seen on the rod having the hard chromium coating whereas the rod having the DLC coating was unaffected. As shown in FIG. 10, after a 90 minutes exposition, a corrosion area clearly appears on the surface of the rod having the hard chromium whereas the rod having the DLC coating is still unaffected.

There is thus provided a method for enhancing the durability of a metallic piston rod and sealing assembly and reducing the friction coefficient between the rod and the cylinder head assembly. The present rod provides, a rate of wear of its surface finish Ra of at least 2.5 times decreased compared to that of a chromium plated rod as known in the art for a lateral load of 20 kN (see FIG. 9), and a friction coefficient decreased by at least 20% (See FIGS. 4-6).

The present invention may be used in hydraulic and pneumatic applications, in a number of fields such as agriculture, forestry, mines, aerospace and industrial applications.

For example, such piston rod may be used in the field of operating arms in waste trucks, as such rods undergo a large number of cycles over the course of a year of operation. The present DLC coating may reduce the friction and increase the lifetime of the sealing elements and thus of the cylinder of the operating arms as a whole.

The scope of the claims should not be limited by the embodiments set forth in the examples, but should be given the broadest interpretation consistent with the description as a whole.

What is claimed is:

1. A method for making a piston rod for a hydraulic cylinder comprising a cylindrical barrel in which a piston connected to the piston rod moves back and forth, the barrel being closed on a first side thereof by a cap and at a second side thereof by a cylinder head where the piston rod comes out of the barrel, the head comprising a fluid seal to prevent pressurized oil from leaking past an interface between the piston rod and the head, the piston rod being in friction contact with the fluid seal, in operating conditions, the method comprising selecting a substrate for the piston rod in one of: steel, stainless steel, aluminum and plastic, selecting a fluid seal in one of: a plastic material, urethane, and Polytetrafluoroethylene, depositing a diamond-like carbon layer, on the piston rod, of a thickness in a range between 1 and 5 μm, the piston rod having a hardness in a range between 1000 and 4000 HV and a coefficient of friction in a range between 0.1 and 0.05, and modifying a resulting surface finish by at least one of polishing, microbead blasting and texturization, yielding a surface roughness profile comprising peaks and valleys with a peak-to-valley height in a range between 0.5 and 2 μm providing hydraulic oil retention between the fluid seal and the piston rod, the piston rod and the fluid seal thus being in contact with a surface comprising peaks and valleys under the operating conditions.

2. The method of claim 1, wherein said depositing the diamond-like carbon layer comprises depositing the diamond-like carbon layer by one of: physical vapor deposition and chemical vapor deposition.

3. The method of claim 1, wherein said depositing the diamond-like carbon layer comprises depositing an external carbon based layer.

4. The method of claim 1, further comprising depositing at least one under layer between the substrate and the diamond-like carbon layer.

5. The method of claim 1, further comprising depositing at least one metallic under layer between the substrate and the diamond-like carbon layer.

6. The method of claim 1, further comprising depositing at least one nitride under layer between the substrate and the diamond-like carbon layer.

7. The method of claim 1, further comprising depositing at least one oxide under layer between the substrate and the diamond-like carbon layer.

8. The method of claim 1, further comprising depositing at least one carbide under layer under between the substrate and the diamond-like carbon layer.

9. The method of claim 1, further comprising depositing at least one silicium-based under layer between the substrate and the diamond-like carbon layer.

10. The method of claim 1, further comprising depositing at least one carbon-based under layer between the substrate and the diamond-like carbon layer.

* * * * *

UNITED STATES PATENT AND TRADEMARK OFFICE
CERTIFICATE OF CORRECTION

| | | |
|---|---|---|
| PATENT NO. | : 11,867,205 B2 | Page 1 of 1 |
| APPLICATION NO. | : 16/321803 | |
| DATED | : January 9, 2024 | |
| INVENTOR(S) | : Luc Mainville | |

It is certified that error appears in the above-identified patent and that said Letters Patent is hereby corrected as shown below:

On the Title Page

Item (12), should read: Mainville

Item (72) Inventor: "Mainville Luc, Joliette (CA)" should be -- Luc Mainville, Joliette (CA) --

Signed and Sealed this
Twentieth Day of August, 2024

Katherine Kelly Vidal
*Director of the United States Patent and Trademark Office*